(12) United States Patent
Park

(10) Patent No.: US 7,531,068 B2
(45) Date of Patent: May 12, 2009

(54) METHOD FOR MANUFACTURING SILICON NANODOT FILM FOR LIGHT EMISSION IN NANO-SIZE PHOTONIC DEVICES

(75) Inventor: Jong Hyurk Park, Daegu-Shi (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 127 days.

(21) Appl. No.: 11/601,197

(22) Filed: Nov. 16, 2006

(65) Prior Publication Data

US 2007/0205095 A1 Sep. 6, 2007

Related U.S. Application Data

(62) Division of application No. 10/740,320, filed on Dec. 17, 2003, now abandoned.

(30) Foreign Application Priority Data

Dec. 24, 2002 (KR) ............... 2002-83758
Feb. 21, 2003 (KR) ............... 2003-11016

(51) Int. Cl.
*C23C 14/32* (2006.01)
(52) U.S. Cl. .................. 204/192.1; 427/162; 427/574
(58) Field of Classification Search .......... 204/192.1; 427/162, 574
See application file for complete search history.

(56) References Cited

U.S. PATENT DOCUMENTS

| | | | | |
|---|---|---|---|---|
| 4,392,453 A | * | 7/1983 | Luscher | 118/726 |
| 4,496,450 A | * | 1/1985 | Hitotsuyanagi et al. | 204/192.15 |
| 5,099,790 A | * | 3/1992 | Kawakami | 118/723 MR |
| 5,423,970 A | * | 6/1995 | Kugler | 204/298.03 |
| 5,522,343 A | * | 6/1996 | Kodama et al. | 118/723 MP |
| 5,542,979 A | * | 8/1996 | Matsuno et al. | 118/719 |
| 5,779,802 A | * | 7/1998 | Borghs et al. | 118/723 MP |
| 6,071,572 A | * | 6/2000 | Mosely et al. | 427/570 |
| 6,255,669 B1 | | 7/2001 | Birkhahn et al. | |

(Continued)

FOREIGN PATENT DOCUMENTS

JP 2-276883 * 11/1990

(Continued)

OTHER PUBLICATIONS

Tsutsumi, T. et al., "Single Electron Memory Characteristic of Silicon Nanodot Nanowire Transistor." Electronic Letters, vol. 36, No. 15, Jul. 20, 2000, pp. 1322-1323.*

(Continued)

*Primary Examiner*—Bret Chen
(74) *Attorney, Agent, or Firm*—Blakely, Sokoloff, Taylor & Zafman LLP

(57) ABSTRACT

A method for manufacturing a silicon nanodot thin film having uniform doping concentration without damage by placing a substrate on a stage within a chamber. The method further including depositing a matrix thin film based on the silicon by PECVD, while doping a light emitting material such as Erbium on the matrix thin film deposited by sputtering process at the same time. The silicon nanodot film obtained by the present invention has an improved light emitting characteristic in long distance communication frequency range of 1.54 μm as well as visible light range.

4 Claims, 1 Drawing Sheet

U.S. PATENT DOCUMENTS

| | | | |
|---|---|---|---|
| 6,340,824 B1 | 1/2002 | Komoto et al. | |
| 6,656,540 B2 * | 12/2003 | Sakamoto et al. | 427/564 |
| 6,677,610 B2 * | 1/2004 | Choi et al. | 257/59 |
| 6,841,082 B2 * | 1/2005 | Ha et al. | 216/44 |
| 6,851,939 B2 * | 2/2005 | Lee et al. | 417/569 |
| 6,940,087 B2 * | 9/2005 | Komoda et al. | 257/10 |
| 7,081,664 B2 * | 7/2006 | Hill | 257/607 |
| 7,092,287 B2 * | 8/2006 | Beulens et al. | 365/185.01 |
| 7,166,485 B1 * | 1/2007 | Li et al. | 438/29 |
| 7,220,609 B2 * | 5/2007 | Zacharias | 438/29 |
| 7,256,426 B2 * | 8/2007 | Li et al. | 257/80 |
| 7,297,642 B2 * | 11/2007 | Gao et al. | 438/787 |
| 2002/0003284 A1 * | 1/2002 | Kordesch et al. | 257/565 |
| 2002/0088972 A1 * | 7/2002 | Varhue et al. | 257/46 |
| 2003/0079757 A1 * | 5/2003 | Shibata et al. | 134/1.1 |
| 2004/0129223 A1 * | 7/2004 | Park | 118/723 MP |
| 2004/0136681 A1 * | 7/2004 | Drewery et al. | 385/142 |
| 2005/0011449 A1 * | 1/2005 | Li et al. | 118/715 |

FOREIGN PATENT DOCUMENTS

| | | |
|---|---|---|
| KR | 1999-0031783 | 5/1999 |
| KR | 1020020069417 | 9/2002 |
| WO | WO/02/061815 * | 8/2002 |

OTHER PUBLICATIONS

Winkler, O., et al., "Concept of floating-dot memory transistors on silicon-on-insulator substrate". Microelectronic Engineering vols. 61-62, Jul. 2002, pp. 497-503.*

Le Quang, A.Q., et al., "An hybrid organic-inorganic approach to erbium-functionalized nanodots for emission in the telecom window". Chemical Physics, vol. 318, Issues 1-2, Nov. 15, 2005, pp. 33-43.*

"Handbook of Chemical Vapor Deposition: Principles, Technology, and Applications", edited by Hugh O. Pierson. Noyes Publications, p. 98, 1992.*

"Er doping of nanocrystalline-Si/SiO2 superlattices"; M. Schmidt, et al, Thin Solid Films, 5 pages.

Si:ER:O layers grown by molecular beam epitaxy: structural, electrical and optical properties, S. Scalese, et al., Material Science & Engineering, 5 pages.

"Effect of hydrogenation on room-temperature 1.54 um Er3+ photoluminescent properties of erbium-doped silicon-rich silicon oxide", J. Shin, et al., Applied Physics Letters, vol. 73, No. 25, Dec. 21, 1998, pp. 3647-3649.

* cited by examiner

METHOD FOR MANUFACTURING SILICON NANODOT FILM FOR LIGHT EMISSION IN NANO-SIZE PHOTONIC DEVICES

The present patent application is a Divisional of application Ser. No. 10/740,320, filed Dec. 17, 2003, which application is abandoned.

BACKGROUND OF THE INVENTION

1. Field of the Invention

The present invention relates to a silicon nanodot film, more specifically, to an apparatus and method for manufacturing the silicon nanodot film for light emission in nano-size photonic devices.

2. Description of the Prior Art

According to recent research, it has been known that an emission efficiency is significantly increased due to quantum confinement effect wherein silicon clusters of nano-size are used as light emitting materials. Additionally, the emission range can be adjusted from a visible emission to a near infrared emission by adjusting the size of the silicon nanodot. In particular, in Er-doped semiconductor light emitting devices, the efficiency of exciting erbium can be significantly improved through the increase of interaction of silicon nanodot with an Erbium (Er) element, which is caused by phenomenon that the distance between the silicon nanodot and an Erbium (Er) element is shortened.

In this regard, in case the Erbium, which has been applied for EDFA (Erbium Doped Fiber Amplifier), is doped on a thin film made of silicon nanodot, the light emitting devices can be operated in various ranges of frequency, and hence it is expected to have a significant influence. Therefore, to compensate drawbacks of amplifying signals through optical pumping in modern long-distance communication systems, a SOC (system on chip) device incorporated with small-sized optical devices such as an optical amplifier can be manufactured through semiconductor integration technology, or a simplified process.

However, silicon material, which is a representative of a semiconductor material, has a serious drawback in application of a photonic device due to its indirect band gap. To utilize the silicon material in the photonic device, a method for doping the silicon with light emitting materials is required, and a technique for forming the silicon structure at nanometer levels should be ensured.

In the prior art, the silicon nanodot film was doped with Erbium by ex-situ ion implanting process, or by pulse type laser deposition process using silicon target doped with Erbium after forming the silicon nanodot film by plasma enhanced chemical vapor method (PECVD).

However, in the former case, damage is induced by a high energy acceleration and doping concentration can not be uniformly adjusted. In the latter case, a possibility of contamination is caused by impurities while manufacturing procedure of the target and different kinds of targets are manufactured in accordance with the doping concentration. For these reasons, the prior art techniques can not be applied to current semiconductor process techniques.

SUMMARY OF THE INVENTION

Therefore, the object of the present invention is to provide an apparatus and method for manufacturing silicon nanodot film for light emission by sputtering with light emitting materials, while depositing matrix thin films related silicon through PECVD.

To achieve the purpose, an apparatus for manufacturing a silicon nanodot thin film capable of emitting light in accordance with the present invention comprises, a chamber having a gas supplying port and a gas exhaust port; a showerhead connected to said gas supplying port and displaced in said chamber; a stage positioned to be opposed to said showerhead and on which a substrate is mounted; and a sputter gun displaced toward said substrate, wherein a matrix thin film is deposited on said substrate by plasma generated between said showerhead and said substrate, while a light emitting material is sputtered from said sputter gun to be doped on said deposited matrix thin film.

In addition, a method for manufacturing the silicon nanodot thin film capable of emitting light in accordance with the present invention to achieve the purpose comprises, a step of displacing a substrate on a stage within a chamber; and a step of depositing a matrix thin film on said substrate by implanting a reaction gas into said chamber and generating plasma, while doping said deposited matrix thin film with a light emitting material by sputtering said light emitting material capable of emitting light into said chamber at the same time.

The matrix thin film is based on one of silicon, silicon oxide, nitride, and carbide, and the light emitting material may be at least one type of rare earth metal, insulating material, or compound.

DESCRIPTION OF THE PREFERRED EMBODIMENTS

Figure 1:
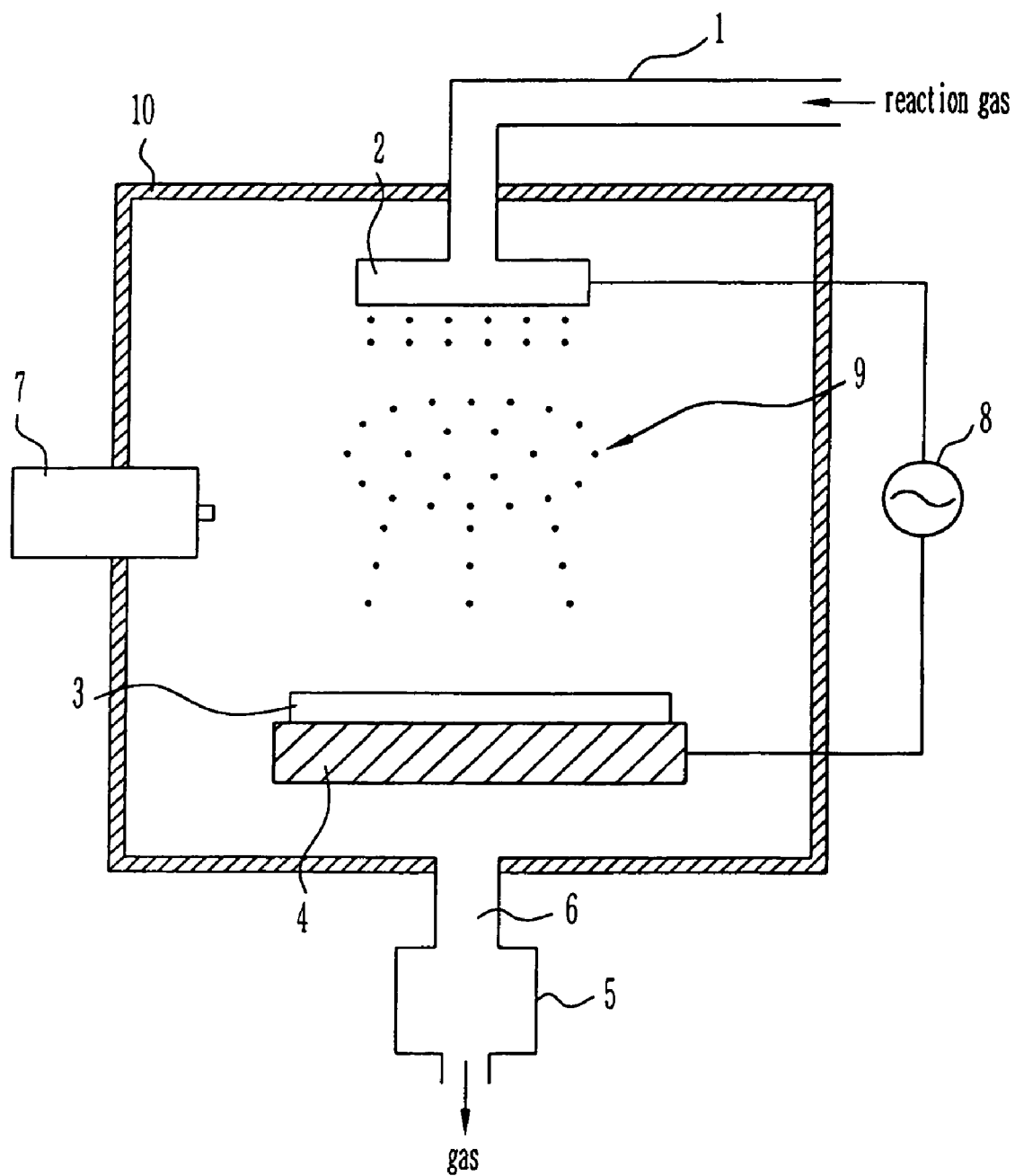
FIG. 1 shows a configuration of deposition equipment used for manufacturing the silicon nanodot film for light emission in accordance with the present invention.

Hereinafter, embodiments of the present invention will be explained with reference to the accompanying drawing. Although the present invention has been described in conjunction with the preferred embodiment, the present invention is not limited to the embodiments, and it will be apparent to those skilled in the art that the present invention can be modified in variation within the scope of the invention.

FIG. 1 shows a configuration of deposition equipment used for manufacturing the silicon nanodot thin film for light emission in accordance with the present invention.

A showerhead 2 connected to a gas supplying port 1 is positioned in an upper portion of a chamber 10, and a stage 4 where a substrate 3 is displaced on is positioned in a lower portion of the chamber. A gas exhausting port 6 connected to an exhausting pump 5 is positioned in the lower portion of the chamber 10, and a sputter gun 7 is directed toward the stage 4 is placed in one side of the chamber.

Hereinafter, a procedure for depositing the silicon nanodot film will be explained by using the above-constructed depositing equipment.

While a reaction gas is being supplied to the chamber 10 through the gas supplying port 1 after the substrate 3 is displaced on the stage 4, a RF power 8 is applied to the showerhead 2 acting as an upper electrode and the stage 4 acting as a lower electrode, thereby a plasma 9 is generated. The generated plasma 9 moves toward the lower portion of the chamber so that a matrix thin film based on the silicon is deposited on the substrate. At this time, if redundant silicons are present in the matrix thin film, by adjusting temperature, pressure, plasma condition, etc of the reaction gas and the substrate, these silicons form nanodots. Composition and growth speed of the thin film changes in a large amount in accordance with the value of the RF power for generating plasma and relative flow rate of the reaction gas, and if these conditions are precisely controlled, silicon nanodots having required size and concentration can be obtained.

For example, when the matrix thin film based on the silicon is deposited and is subject to thermal treatment by applying 20 watts of RF power thereto while flowing a 1:1 ratio of $SiH_4$ and $O_2$ gas flow rate under the process condition of 0.1 Torr and 150° C., the silicon oxidation film having silicon nanodots is obtained, and in this case the size of the silicon nanodot is 3 nm, and the density thereof is $10^{17} cm^{-3}$.

At the same time, a light emitting material is sputtered from the sputter gun 7 consisting of a target having the light emitting material such as Erbium attached and a device for generating plasma for sputtering the light emitting material attached to the target, so that the matrix thin film deposited on the substrate 3 is doped with the light emitting material. The doping concentration of the light emitting material can be adjusted by controlling the sputtering speed of the sputter gun 7, and the present invention can readily control the doping concentration of the light emitting material by single process of in-situ type.

For example, the light emitting material is a rare earth metal, insulating material or their compound., and in the case of the rare earth metal such as Erbium, 0.5 to −5 kV of direct current bias voltage is applied in a state of Ar plasma so that the sputtering is performed.

A high temperature deposition can be performed for the stage 4 having the substrate 3 thereon during deposition and doping processes by heating the stage or a uniform deposition can be performed by rotating the stage.

When the matrix thin film is deposited with an oxidation or nitride having high energy gap, implanting possibility of electron and hole due to a low conductivity of the conductive element is decreased, however, this drawback can be solved by manufacturing a superlattice structure alternatively having an insulating silicon nanodot thin film and a doped silicon layer. Furthermore, if a plurality of sputter gun 7 is mounted in the chamber 10, a light emitting material such as various kinds of rare earth metal, insulating material, or compound as well as Erbium can be simultaneously doped.

For example, by doping a rare earth metal such as Er, Eu, Pr, Nd, Tm, etc emitting visible light or ultrared light on a material having high energy gap such as silicon nitride, silicon oxide, silicon carbide, etc, a thin film having various light emitting characteristic can be manufactured.

The present invention can provide a silicon nanodot thin film having uniform doping concentration without any damage by depositing a matrix thin film based on the silicon by PECVD, while doping a light emitting material such as Erbium on the matrix thin film deposited by a sputtering process at the same time. The silicon nanodot thin film obtained by the present invention has an improved light emitting characteristic in long distance communication frequency range of 1.54 μm as well as visible light range, so that the photoelectric element using silicon as a light emitting material in nano level can be manufactured, and the method for manufacturing the silicon nanodot thin film of the present invention can interact with the current semiconductor process technique, so that element integration can be effectively increased while using a simplified process.

What is claimed is:

1. A method for manufacturing a silicon nanodot film for light emission, comprising:
    (a) placing a substrate on a stage within a chamber; and
    (b) depositing a matrix thin film in the form of nanodots on said substrate by introducing a reaction gas into said chamber and generating plasma, while doping said deposited matrix thin film with a light emitting material by sputtering said light emitting material into said chamber.
2. The method as claimed in claim 1,
    wherein said matrix thin film is based on one of silicon, silicon oxide, nitride, and carbide.
3. The method as claimed in claim 1,
    wherein said light emitting material is at least one of a rare earth metal and an insulating material.
4. The method as claimed in claim 3,
    wherein said rare earth metal is Erbium.

* * * * *